United States Patent
Ramkumar et al.

(10) Patent No.: US 6,534,378 B1
(45) Date of Patent: Mar. 18, 2003

(54) METHOD FOR FORMING AN INTEGRATED CIRCUIT DEVICE

(75) Inventors: Krishnaswamy Ramkumar, San Jose, CA (US); Chidambaram G. Kallingal, Sunnyvale, CA (US); Sriram Madhavan, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/143,899

(22) Filed: Aug. 31, 1998

(51) Int. Cl.$^7$ ............................................... H01L 23/58
(52) U.S. Cl. ...................... 438/401; 438/462; 438/975
(58) Field of Search ................................ 438/401, 975, 438/462; 257/797

(56) References Cited

U.S. PATENT DOCUMENTS

| | | |
|---|---|---|
| 3,629,023 A | 12/1971 | Strehlow |
| 3,979,239 A | 9/1976 | Walsh |
| 4,256,535 A | 3/1981 | Banks |
| 4,261,791 A | 4/1981 | Shwartzman |
| 4,373,991 A | 2/1983 | Banks |
| 4,505,720 A | 3/1985 | Gabor et al. |
| 4,600,469 A | 7/1986 | Fusco et al. |
| 4,677,043 A | 6/1987 | Cordes, III et al. |
| 4,768,883 A | 9/1988 | Waldo et al. |
| 4,778,532 A | 10/1988 | McConnell et al. |
| 4,789,648 A | 12/1988 | Chow et al. |
| 4,879,258 A | 11/1989 | Fisher |
| 4,933,715 A | 6/1990 | Yamada et al. |
| 4,944,836 A | 7/1990 | Beyer et al. |
| 4,954,141 A | 9/1990 | Takiyama et al. |
| 4,962,423 A | 10/1990 | Yamada et al. |
| 4,968,381 A | 11/1990 | Prigge et al. |

(List continued on next page.)

OTHER PUBLICATIONS

M. Nandakumar et al., Shallow Trench Isolation for Advanced ULSI CMOS Technologies. IEEE 1998, pp. 133–136.*

(List continued on next page.)

*Primary Examiner*—Olik Chaudhuri
*Assistant Examiner*—Anh D. Mai
(74) *Attorney, Agent, or Firm*—Kevin L. Daffer; Conley, Rose & Tayon P.C.

(57) ABSTRACT

The present invention advantageously provides a method for retaining a substantially transparent dielectric above alignment marks during polishing of the dielectric to ensure that the alignment marks are preserved for subsequent processing steps. According to an embodiment, alignment marks are etched into a semiconductor substrate. Thereafter, a pad oxide layer is deposited across the substrate surface, followed by the deposition of a first nitride layer. Isolation trenches which are deeper than the alignment mark trenches are formed spaced distances apart within the substrate. Optical lithography may be used to define the regions of the first nitride layer, the pad oxide layer, and the substrate to be etched. The isolation trenches thus become the only areas of the substrate not covered by the pad oxide layer and the first nitride layer. A substantially transparent dielectric, e.g., oxide, is then deposited across the semiconductor topography to a level spaced above the first nitride layer. In this manner, both the isolation trenches and the alignment mark trenches are filled. The dielectric is then subjected to a polish that removes the dielectric above the isolation trenches to the nitride layer and the dielectric above the alignment mark trenches to a level above the nitride layer. A slurryless fixed abrasive polishing technique may be used to planarize the dielectric. A polysilicon/nitride stack which is deposited across the topography may be patterned using lithography. Light is reflected from the alignment marks to detect their positions so that a reticle can be aligned to the polysilicon/nitride stack during the lithography process.

14 Claims, 6 Drawing Sheets

U.S. PATENT DOCUMENTS

| | | | |
|---|---|---|---|
| 4,986,878 A | 1/1991 | Malazgirt et al. | |
| 5,032,203 A | 7/1991 | Doy et al. | |
| 5,057,462 A | 10/1991 | Eisenberg et al. | |
| 5,064,683 A | 11/1991 | Poon et al. | |
| 5,084,419 A | 1/1992 | Sakao | |
| 5,209,816 A | 5/1993 | Yu et al. | |
| 5,273,558 A | 12/1993 | Nelson et al. | |
| 5,288,333 A | 2/1994 | Tanaka et al. | |
| 5,320,706 A | 6/1994 | Blackwell | |
| 5,320,978 A | 6/1994 | Hsu | |
| 5,340,370 A | 8/1994 | Cadien et al. | |
| 5,346,584 A | 9/1994 | Nasr et al. | |
| 5,362,668 A | 11/1994 | Tasaka | |
| 5,362,669 A | 11/1994 | Boyd et al. | |
| 5,363,550 A | 11/1994 | Aitken et al. | |
| 5,376,482 A | 12/1994 | Hwang et al. | |
| 5,389,194 A | 2/1995 | Rostoker et al. | |
| 5,389,579 A | 2/1995 | Wells | |
| 5,392,361 A | 2/1995 | Imaizumi et al. | |
| 5,395,801 A | 3/1995 | Doan et al. | |
| 5,401,691 A | 3/1995 | Caldwell | |
| 5,406,111 A | 4/1995 | Sun | |
| 5,435,772 A | 7/1995 | Yu | |
| 5,436,488 A | 7/1995 | Poon et al. | |
| 5,441,094 A | 8/1995 | Pasch | |
| 5,459,096 A | 10/1995 | Venkatesan et al. | |
| 5,468,983 A | 11/1995 | Hirase et al. | |
| 5,486,265 A | 1/1996 | Salugsugan | |
| 5,492,858 A | 2/1996 | Bose et al. | |
| 5,494,857 A | 2/1996 | Cooperman et al. | |
| 5,503,962 A | 4/1996 | Caldwell | |
| 5,525,840 A | 6/1996 | Tominaga | |
| 5,531,861 A | 7/1996 | Yu et al. | |
| 5,541,427 A | 7/1996 | Chappell et al. | |
| 5,551,986 A | 9/1996 | Jain | |
| 5,573,633 A | 11/1996 | Gambino et al. | |
| 5,578,523 A | 11/1996 | Fiordalice et al. | |
| 5,591,239 A | 1/1997 | Larson et al. | |
| 5,595,937 A | 1/1997 | Mikagi | |
| 5,607,345 A | 3/1997 | Barry et al. | |
| 5,616,513 A | 4/1997 | Shepard | |
| 5,629,242 A | 5/1997 | Nagashima et al. | |
| 5,643,406 A | 7/1997 | Shimomura et al. | |
| 5,643,823 A | 7/1997 | Ho et al. | |
| 5,643,836 A | 7/1997 | Meister et al. | |
| 5,652,176 A | 7/1997 | Maniar et al. | |
| 5,656,097 A | 8/1997 | Olesen et al. | |
| 5,664,990 A | 9/1997 | Adams et al. | |
| 5,665,202 A | 9/1997 | Subramanian et al. | |
| 5,666,985 A | 9/1997 | Smith, Jr. et al. | |
| 5,702,977 A | 12/1997 | Jang et al. | |
| 5,728,308 A | 3/1998 | Muroyama | |
| 5,776,808 A | 7/1998 | Muller et al. | |
| 5,786,260 A * | 7/1998 | Jang et al. | 438/401 |
| 5,837,612 A | 11/1998 | Ajuria et al. | |
| 5,893,744 A * | 4/1999 | Wang | 438/401 |
| 5,906,532 A | 5/1999 | Nakajima et al. | |
| 5,919,082 A | 7/1999 | Walker et al. | |
| 5,952,687 A | 9/1999 | Kawakubo et al. | |
| 5,963,841 A * | 10/1999 | Karlsson et al. | 438/585 |
| 6,010,964 A * | 1/2000 | Glass | 438/692 |
| 6,043,133 A * | 3/2000 | Jang et al. | 438/401 |

OTHER PUBLICATIONS

J. Golz et al., Optical Flatness and Alignment Mark Contrast in Highly Planar Technologies. IEEE 1997, pp. 300–304.*

Wolf, *Silicon Processing for the VLSI Era vol. 2: Process Integration*, Lattice Press 1990, pp. 189–191.

Singer, "CMP Developers Take Aim at STI Applications" and "Slurry–Free CMP Reduces Dishing, Speeds Process," *Semiconductor International*, Feb. 1998, vol. 21, No. 2, p. 40.

Ali et al., "Chemical–Mechanical Polishing of Interlayer Dielectric: A Review," *Solid State Technology*, Oct. 1994, pp. 63–68.

Sivaram et al., "Developments in Consumables Used in the Chemical Mechanical Polishing of Dielectrics," *International Conference on Solid State Devices & Materials*, Aug. 1995, p. 166.

* cited by examiner

```
┌─────────────────────────────┐
│ Deposit a particle-free liquid │
│ onto the surface of an abrasive │
│ polishing surface comprising │
│ particles partially fixed into a │
│ polymer-based matrix.       │
│            21               │
└─────────────────────────────┘
              │
              ▼
┌─────────────────────────────┐
│ Position the semiconductor  │
│ topography face-down upon the │
│ polishing surface.          │
│            23               │
└─────────────────────────────┘
              │
              ▼
┌─────────────────────────────┐
│ Rotate the polishing surface │
│ relative to the semiconductor │
│ topography while applying a │
│ force to the polishing surface to │
│ remove elevationally raised │
│ regions of the topography at a │
│ faster rate than elevationally │
│ recessed regions.           │
│            25               │
└─────────────────────────────┘
```

METHOD FOR FORMING AN INTEGRATED CIRCUIT DEVICE

BACKGROUND OF THE INVENTION

1. Field of the Invention

This invention relates to integrated circuit manufacturing and, more particularly, to retaining a substantially transparent dielectric above alignment marks during polishing of the dielectric to ensure that the alignment marks are preserved for subsequent alignment thereto.

2. Description of the Related Art

Fabrication of an integrated circuit involves numerous processing steps. After gate areas have been defined on a semiconductor substrate and implant regions (e.g., source/drain regions) have been formed in the substrate, an interlevel dielectric is formed over the topography to make electrical contact to the gate areas and the implant regions. Interconnects are then formed across the interlevel dielectric to connect the implant regions and/or the gate areas through ohmic contacts formed earlier through the interlevel dielectric. Alternating levels of interlevel dielectric and interconnect may be placed across the semiconductor topography to form a multi-level integrated circuit.

A technique known as "photolithography" is generally used to pattern the various levels of an integrated circuit. Photolithography entails transferring an optical image to a photosensitive film from a patterned mask plate (i.e., reticle) placed in proximity to the film. The photosensitive film, i.e., "photoresist" is formed upon the layer of material to be patterned. A mask plate having both opaque and transparent regions is placed above the resist. Radiation is transmitted through only the transparent portions of the mask plate to the resist. The solubility of resist regions exposed to the radiation is altered by a photochemical reaction. A solvent may be used to remove the resist areas of higher solubility. The resulting patterned resist film serves to protect underlying conductive or dielectric material from etching or ion implantation.

It is critical to align successive layers of an integrated circuit to each other to ensure proper operation of the circuit. In particular, the mask plate pattern must be properly aligned to previously formed features in a semiconductor topography during the lithography process. In the extreme, lithographic misalignment may lead to shorting between structures that should be isolated from each other, and isolation of structures that should be coupled to each other. Typically, an alignment system, such as a stepper, is used to align the mask plate to the semiconductor topography. The alignment system may employ an alignment mark (e.g., a trench in the form of a geometric shape, such as a square, a "+", or an "X") which has been formed in the substrate as a reference point. Although the original alignment mark may be covered by subsequently deposited layers, the step height of the alignment mark (the depth of the trench) is replicated in those layers. The alignment system directs a laser beam to the replicated alignment mark residing in the most recently deposited layer. The light striking the replicated alignment mark is reflected back to sensing devices which detect the exact position of the alignment mark. Alignment is achieved by moving the mask plate until a feature, i.e., an alignment guide, in the mask plate is correctly positioned with respect to the alignment mark.

As successive layers are deposited across previously patterned layers of an integrated circuit, elevational disparities develop across the surface of each layer. If left unattended, the elevational disparities in each level of an integrated circuit can lead to various problems. For example, when an interconnect is placed across a dielectric layer having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions. Furthermore, correctly patterning layers upon a topological surface containing fluctuations in elevation may be difficult using optical lithography. The depth-of-focus of the lithography alignment system may vary depending upon whether the resist resides in an elevational "hill" or "valley" area. The presence of such elevational disparities therefore makes it difficult to print high resolution features.

Figure 1:
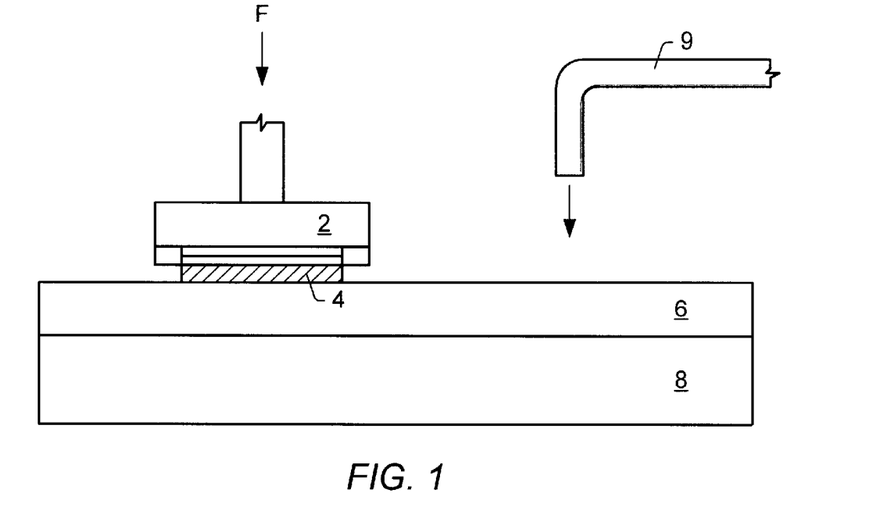
FIG. 1 is a side plan view of an apparatus that may be used to chemical-mechanical polish a semiconductor topography.

Techniques involving chemical and mechanical abrasion (e.g., chemical-mechanical polishing) to planarize or remove the surface irregularities have grown in popularity. As shown in FIG. 1, a typical chemical-mechanical polishing ("CMP") process involves placing a semiconductor wafer 4 face-down on a polishing pad 6 which lies on or is attached to a rotatable table or platen 8. A popular polishing pad medium comprises polyurethane or polyurethane-impregnated polyester felts. During the CMP process, polishing pad 6 and semiconductor wafer 4 may be rotated while a carrier 2 holding wafer 4 applies a downward force F upon polishing pad 6. A "slurry" consisting of an abrasive and a fluid-based chemical is deposited from a conduit 9 positioned above pad 6 onto the surface of polishing pad 6. The slurry may fill the space between pad 6 and the surface of wafer 4. The polishing process may involve a chemical in the slurry reacting with the surface material being polished. The rotational movement of polishing pad 6 relative to wafer 4 causes abrasive particles entrained within the slurry to physically strip the reacted surface material from wafer 4. The pad 6 itself may also physically remove some material from the surface of the wafer 4. The abrasive slurry particles are typically composed of silica, alumina, or ceria.

Unfortunately, planarizing the layers of an integrated circuit may also planarize the alignment mark areas which have been transferred to those layers from the substrate. Absent the topography of the alignment marks, the lithography alignment system may be incapable of properly aligning a mask plate to the previously patterned layers. The commonly used solution to dealing with planarized alignment marks uses a photolithographic step to expose the alignment mark areas and protect the rest of the substrate with resist. In the next step, the planarized dielectric in the alignment mark areas is etched away so as to recover the original pattern of the alignment marks. This solution therefore adds two steps to the process flow. It would therefore be desirable to develop methods for preserving alignment marks in a substrate and precisely aligning a mask plate to a planarized semiconductor topography having such marks. That is, an alignment technique is desired which does not require the replication of alignment marks from the substrate into subsequent layers to properly align those layers.

SUMMARY OF THE INVENTION

The problems outlined above are in large part solved by an embodiment of the present invention in which a substantially transparent dielectric is retained above one or more alignment marks while polishing the dielectric. The optical property of the alignment mark is preserved even though the polishing process removes its replicated pattern from the overlying dielectric. The alignment mark may be formed by etching an alignment mark trench into a semiconductor substrate. The semiconductor substrate may comprise a bulk semiconducting material, such as Si, SiGe, Ge, GaAs, SiGeAs, etc., which may be conventionally doped with N-dopants, such as P, As, Sb, S, Se, and/or P-dopants, such as B, $BF_2$, upon which subsequent thin films are deposited and/or patterned. A silicon nitride ("nitride") layer may be deposited on the substrate-embodied alignment mark during a shallow trench isolation process, before or after forming the shallow trench. The nitride layer may form a mask during the formation of densely packed isolation trenches within the substrate. Advantageously, because of its translucence, the nitride layer may be retained above the alignment mark (in the alignment mark trench) while a transparent dielectric is deposited across the topography. No time-consuming selective etch technique is therefore required to remove the nitride layer from the alignment mark prior to the deposition of the transparent dielectric. The transparent dielectric may advantageously fill both the alignment mark trench and the isolation trench (or trenches).

The isolation trenches are formed within the area of the substrate allotted for the ensuing integrated circuit while the alignment mark trench is formed outside this area of the substrate. The densely packed configuration of the isolation trenches may result in the non-planarity of the dielectric above those trenches. In particular, because of the proximity of the isolation trenches to each other as the transparent dielectric is deposited, closely spaced recessed regions tend to develop in the dielectric above the isolation trenches. In contrast, the alignment mark trench (or trenches) is relatively farther away from each other and/or from other structures whose changes affect the topography. The dielectric placed above the alignment mark trench includes a recessed region that is not as closely packed with other recessed regions. Further, the depth of the alignment mark trench may be less than that of the isolation trenches, resulting in the recessed region over the alignment mark trench being smaller in size than the recessed regions over the isolation trenches. A larger elevational disparity may therefore exist in a portion of the dielectric above the isolation trenches than in a portion of the dielectric above the alignment mark trench. The ratios of the width, length, and/or depth of the alignment mark trench to those respective dimensions of the isolation trench may vary according to design preferences and criteria. The following table shows possible ranges for the depths and widths of the alignment mark trench and the isolation trench, as well as the preferred depths and widths:

|  | Alignment Mark Trench | Isolation Trench |
| --- | --- | --- |
| Depth | 1,200 Å ± 200 Å | 4,000 Å ± 400 Å |
| Width | 8 μm ± 0.8 μm | 0.35 μm ± 0.05 μm |

The upper surface of the transparent dielectric is polished by a technique which polishes non-planar surfaces faster than relatively planar surfaces. Because the dielectric above the alignment mark has less elevational disparity than the dielectric above the isolation trenches, it is generally planarized at a slower rate than the dielectric above the isolation trenches. Once the dielectric surface above the alignment mark is planarized, its polish rate becomes so slow that very little dielectric is further removed from above the alignment mark. However, the non-planar dielectric surface above the isolation trenches is polished at a relatively high rate for a longer period of time until it too becomes substantially planarized. Consequently, more of the dielectric may be removed from above the isolation trenches than from above the alignment mark trench during polishing. As such, the dielectric surface extending over the isolation trenches may be polished to a level commensurate with the upper surface of the nitride layer, while the dielectric surface extending over the alignment mark trench is only removed to a level spaced above the nitride layer, typically from 100 Å to 5,000 Å above the nitride layer, preferably 200 Å Å to 3,000 Å, and more preferably 300 Å to 2,500 Å.

Although the alignment mark pattern is not transferred to the remaining transparent dielectric, a reticle may be accurately aligned to a polycrystalline silicon/nitride stack subsequently formed upon the transparent dielectric. That is, the alignment mark may be detected by passing light (e.g., laser light) through the transparent dielectric and the nitride layer to the alignment mark in the silicon substrate. The transparent dielectric may comprise a material that has a refractive index substantially dissimilar to the refractive index of the silicon substrate. Examples of such dielectrics include silicon dioxide ("oxide"), alumina, alumina silicates, and oxynitrides of aluminum and/or silicon, which may be conventionally doped with phosphorous, and/or boron, fluoride, etc. Preferably, the dielectric is $SiO_2$. As such, the presence of the transparent dielectric within the alignment mark trench provides for a high reflectivity of light (e.g., laser light) at the substrate surface within the trench. The nitride and transparent dielectric layers comprise a visually discernable thickness upon the trench dissimilar from a visually discernable thickness upon the substrate laterally adjacent the trench. Therefore, the reflectivity disparity between the trench area and the substrate outside the trench is sufficient to afford good detection of the alignment mark. Absent the transparent dielectric and the nitride layer, a polycrystalline silicon ("polysilicon") layer would be deposited into the trench upon the substrate surface. It is believed that a very low reflectivity of light would be observed at the polysilicon/Si interface since these materials have similar compositions and refractive indexes. Consequently, the alignment mark would not be visible to a detection device. Placing the planarized transparent dielectric and the nitride layer having a refractive index substantially dissimilar to that of Si within the alignment mark trench therefore provides for better detection of the alignment mark. This alignment scheme may avoid the case of additional steps to recover the original pattern (topography) of the alignment marks.

According to an embodiment, alignment marks are formed within areas of a semiconductor substrate not to be occupied by devices of an ensuing integrated circuit. For example, the alignment marks may be placed near the edges of a silicon wafer. Each alignment mark may be formed by etching an alignment mark trench into an upper portion of the substrate. Thereafter, a "pad" oxide layer is deposited across the substrate surface, followed by the deposition of a first nitride layer. The pad oxide layer serves to relieve the mechanical stresses that normally exist between silicon and nitride. Isolation trenches which may be deeper than the alignment mark trenches are subsequently formed spaced distances apart within the substrate. Optical lithography may be used to define the regions of the first nitride layer, the pad oxide layer, and the substrate to be etched. The isolation trenches thus become the only areas of the substrate not covered by the pad oxide layer and the first nitride layer. A liner oxide layer may then be thermally grown upon the sidewalls and floor of the isolation trenches. A substantially transparent dielectric is then deposited across the semiconductor topography to a level spaced above the first nitride layer. In this manner, both the isolation trenches and the alignment mark trenches are filled.

The upper surface of the transparent dielectric may then be polished. Preferably, a "fixed-abrasive" technique is used to polish the dielectric. The fixed-abrasive technique involves placing a liquid which is substantially free of particulate matter between the dielectric surface and an abrasive polishing surface. The liquid contains no chemical constituent that would necessarily react with the topography. The polishing surface is moved relative to the semiconductor topography so as to polish the dielectric. The first nitride layer may serve as a polish stop, assuming that the polish rate of nitride is relatively slow. The liquid applied to the polishing surface preferably comprises deionized water, however, other liquids which have a near-neutral pH value may alternatively be directed onto the abrasive polishing surface. A more acidic or basic liquid might undesirably increase the removal rate of the first nitride layer. The pH that is chosen for the polishing process is one suitable for the dielectric surface and the abrasive polishing pad. The polishing surface comprises a polymer-based matrix embedded with particles selected from the group consisting of cerium oxide, cerium dioxide, aluminum oxide, silicon dioxide, titanium oxide, chromium oxide, and zirconium oxide. The abrasive polishing surface belongs to a polishing pad which is substantially resistant to deformation even when placed across an elevationally recessed region of relatively large lateral dimension (e.g., over 200 microns lateral dimension). Therefore, the pad is non-conformal to the underlying surface and thus does not come in contact with elevationally recessed regions of the dielectric.

It is believed that the particles dispersed throughout the abrasive surface in combination with the polishing liquid interact chemically and physically with those regions of the dielectric placed in contact with the particles. However, the liquid alone is believed to have little effect on the dielectric and thus does not remove recessed areas of the dielectric which the abrasive surface does not contact. As such, elevationally raised regions of the dielectric are removed at a substantially faster rate than elevationally recessed regions. The polish rate slows down significantly upon areas of the dielectric that approach planarity. The transparent dielectric above the alignment marks is substantially planarized before it is completely removed from above the first nitride layer. The polish rate of the transparent dielectric above the alignment marks decreases at this point, allowing the dielectric to remain above the first nitride layer. In contrast, the transparent dielectric above the isolation trenches is removed from the first nitride layer, which is where the dielectric surface is substantially planarized.

In an alternate embodiment, the transparent dielectric may be polished using well-known CMP. That is, the frontside of the semiconductor topography may be forced against a CMP polishing pad while the polishing pad and the topography are rotated relative to each other. A CMP slurry entrained with abrasive particles, e.g., ceria, silica, or alumina, is dispensed upon the polishing pad surface to aid in the removal of the transparent dielectric. During the CMP process, the slurry may undesirably react with the dielectric in elevationally recessed regions, releasing the surface material from its union with the bulk of the dielectric. Further, the polishing pad, being somewhat conformal to the topological surface, may deform to the elevationally raised and recessed topography by "bowing" in an arcuate pattern in response to a force being applied thereto. The deformation of the polishing pad thus may further contribute to the removal of the elevationally recessed regions by physically stripping the reacted surface material of the dielectric. Therefore, while the removal rate of elevationally raised regions of the dielectric may be greater than that of the elevationally recessed regions, a significant amount of the elevationally recessed regions may, unfortunately, undergo removal. This phenomena is known as the "dishing" effect and may reduce the degree of planarization that can be achieved by the CMP process. The elevational disparities in the dielectric surface spaced above the alignment mark and the isolation trenches thus might be impossible to eliminate completely. Using the slurry-based CMP process, however, still leaves a significant thickness of the dielectric over the alignment mark to provide for detection of the alignment mark even after the dielectric over the substrate adjacent the isolation trenches has been removed.

Subsequent to polishing the dielectric, portions of the first nitride layer and the pad oxide layer which are no longer covered by the transparent dielectric are etched from the substrate surface. In this manner, the substrate surface proximate the trench isolation structures is exposed while the substrate surface proximate the alignment marks remains concealed. A gate dielectric is then formed upon those exposed portions of the substrate surface. A polysilicon layer and a second nitride layer are sequentially deposited across the topography. Photoresist is then spin-on deposited across the second nitride layer. An alignment system, e.g., a stepper, is used to align a reticle to the semiconductor topography. The alignment system first passes light, e.g., laser light, through the materials overlying the alignment marks to the alignment mark areas. The reflectivity of light at the alignment mark surfaces is in contrast to the reflectivity of light at the substrate surfaces outside the alignment mark areas. This contrast allows the alignment marks to be detected. Using the alignment marks as references, the alignment mark system then positions the reticle above the photoresist. The photoresist is patterned by passing radiation, e.g., ultraviolet light, through transparent regions of the reticle to the photoresist. Select portions of the second nitride layer and the polysilicon layer not covered by the photoresist are then etched. In this manner, polysilicon gate conductors are aligned to regions of the substrate laterally spaced from the trench isolation structures. A capping nitride layer residing upon the gate conductors electrically isolates the gate conductor from subsequently formed contacts and interconnects.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
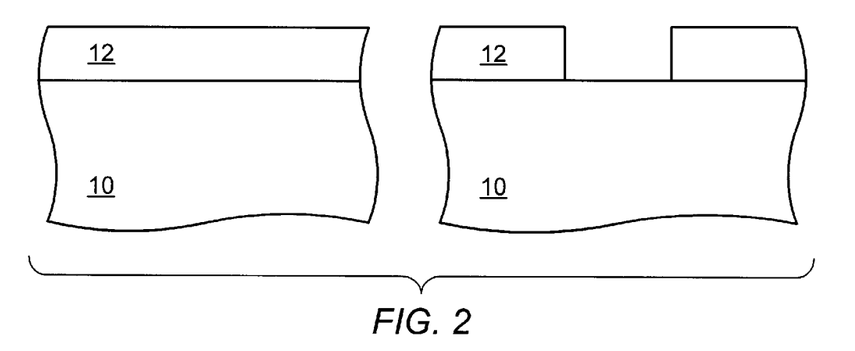
FIG. 2 is a partial cross-sectional view of two sections of a semiconductor topography, wherein a photoresist layer is patterned upon the surface of a silicon-based substrate.
Figure 3:
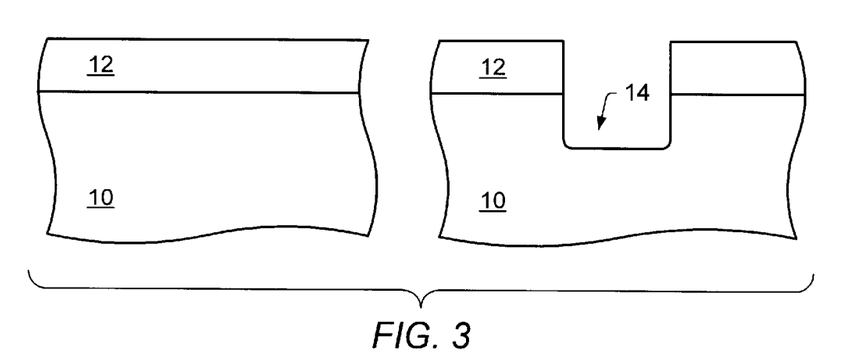
FIG. 3 is a partial cross-sectional view of the semiconductor topography, wherein a select portion of the substrate exposed by the photoresist layer is etched to form an alignment mark trench, subsequent to the step in FIG. 2.
Figure 4:
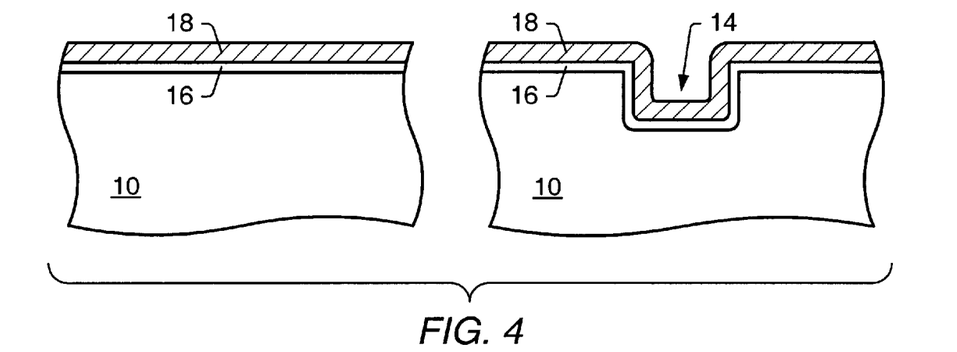
FIG. 4 is a partial cross-sectional view of the semiconductor topography, wherein the photoresist layer is removed, and a pad oxide layer and a first nitride layer are sequentially deposited upon the substrate, subsequent to the step in FIG. 3.

Turning to FIG. 2, different sections of a semiconductor substrate 10 are presented. Substrate 10 may comprise single crystalline silicon slightly doped with n-type or p-type impurities. A layer of photoresist 12 may be patterned, e.g., by optical lithography upon substrate 10 to expose a select portion of the depicted substrate. Turning to FIG. 3, the select portion of substrate 10 not covered by the layer of photoresist 12 is then etched to form an alignment mark trench 14 having a shallow depth of, e.g., from 500 Å to 2,000 Å, preferably 1,000 Å to 1,400 Å, and in one embodiment, 1,200 Å. Alignment mark trench 14 may be formed using, e.g., a $CF_4$ plasma etch. After removing the layer of photoresist 12, a pad oxide layer 16 may be grown across substrate 10 using wet or dry thermal oxidation of the silicon substrate, as shown in FIG. 4. Alternatively, pad oxide layer 16 may be deposited on substrate 10 using chemical-vapor deposition ("CVD") from, e.g., a gas provided with $SiH_4$ and $O_2$. Pad oxide layer 16 may have a thickness of, e.g., from 50 to 250 Å, preferably 70 to 150 Å, and in one embodiment, 100 Å. A nitride layer 18 having a thickness of, e.g., from 500 Å to 2,000 Å, preferably 1,200 Å to 1,700 Å, and in one embodiment, 1,500 Å is then CVD deposited across oxide layer 16 using, e.g., a gas provided with $SiH_4$ and $NH_3$.

Figure 5:
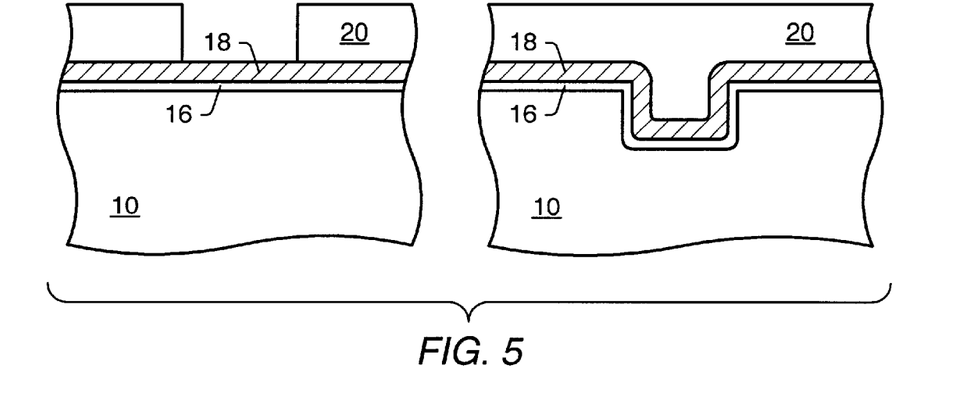
FIG. 5 is a partial cross-sectional view of the semiconductor topography, wherein a photoresist layer is patterned upon the first nitride layer, subsequent to the step in FIG. 4.
Figure 6:
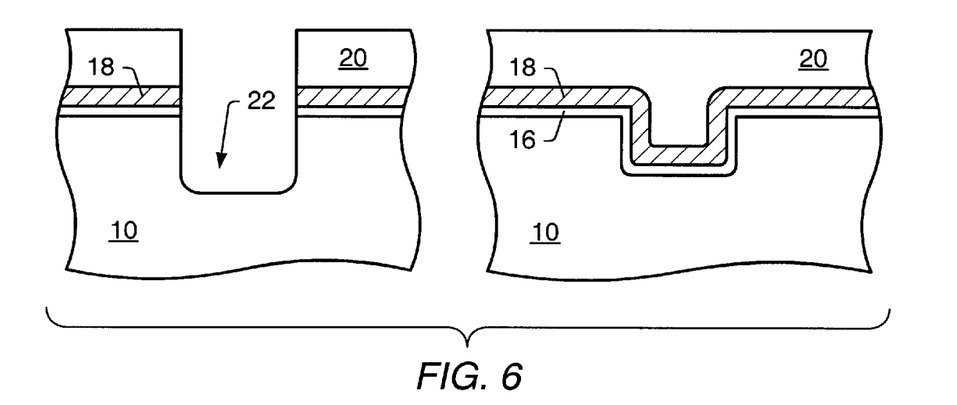
FIG. 6 is a partial cross-sectional view of the semiconductor topography, wherein select portions of the first nitride layer, pad oxide layer, and substrate are etched to form a shallow isolation trench.
Figure 7:
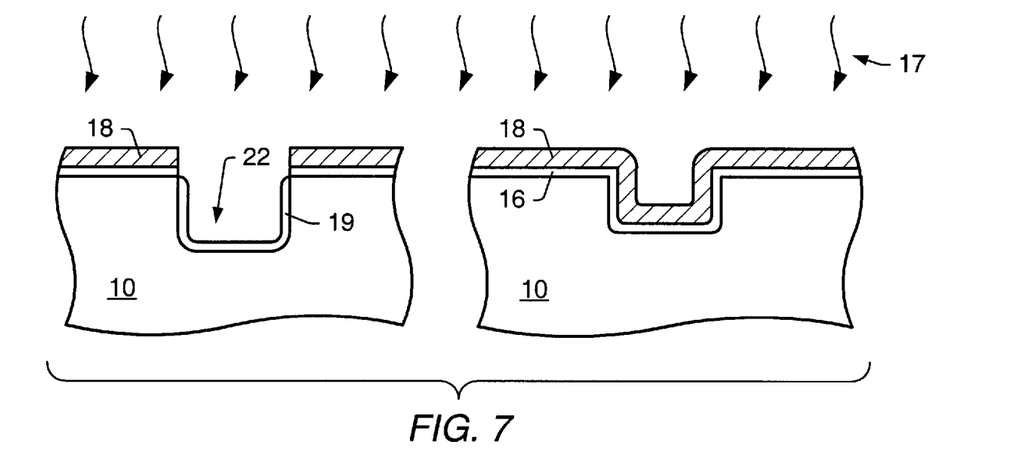
FIG. 7 is a partial cross-sectional view of the semiconductor topography, wherein a liner oxide layer is thermally grown upon the sidewalls and floor of the isolation trench, subsequent to the step in FIG. 6.

Turning to FIG. 5, a photoresist layer 20 may then be patterned by lithography upon nitride layer 18 to expose a select portion of nitride layer 18. Thereafter, as shown in FIG. 6, that select portion of nitride layer 18 not covered by photoresist layer 20 is etched using, e.g., a dry, plasma etch technique. In this manner, an isolation trench 22 having a depth of, e.g., 3,500 Å to 4,500 Å, preferably 3,600 Å to 4,400 Å, and in one embodiment, 4,000 Å is formed within semiconductor substrate 10 between a pair of active areas. FIG. 7 depicts an oxide liner 19 subsequently being formed at the periphery of isolation trench 22 with a wet or dry thermal oxidation process. Photoresist layer 20 may be stripped from nitride layer 18 prior to forming oxide liner 19. Substrate 22 is heated by subjecting the substrate to radiation 17 provided from, e.g., an annealing furnace or a Rapid Thermal Processing ("RTP") chamber. Nitride layer 18 which is substantially impermeable to oxygen prevents the oxidation of underlying areas of substrate 10 during the formation of oxide liner 22.

Figure 8:
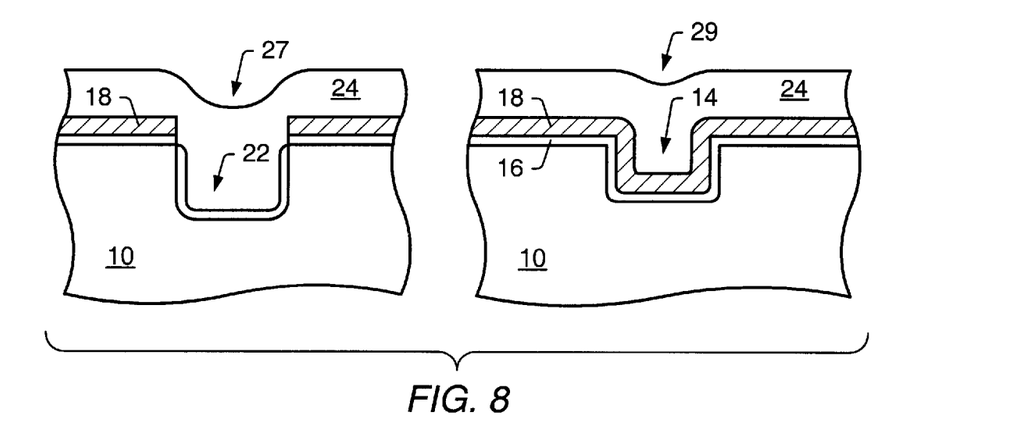
FIG. 8 is a partial cross-sectional view of the semiconductor topography, wherein a substantially transparent dielectric is deposited across the nitride layer and into the isolation trench and the alignment mark trench, subsequent to the step in FIG. 7.

As shown in FIG. 8, a substantially transparent dielectric 24 is CVD deposited across the semiconductor topography to a level spaced above the nitride layer 18 outside isolation trench 22. The upper surface of the as-deposited dielectric 24 includes a first recess region 27 above isolation trench 22 and a second recess region 29 above alignment mark trench 14. Since the depth of isolation trench 22 is greater than that of alignment mark trench 14, the step height created by first recess region 27 is greater than that created by second recess region 29. Dielectric 24 is preferably composed of oxide, but may also be composed of other transparent dielectrics which have indexes of refraction dissimilar from silicon substrate 10. Alignment mark trench 14 is thus filled with a dielectric 24 that causes the reflectivity of light from trench 14 to be different from the reflectivity of light from the substrate 10 exterior to the trench 14.

Figure 9:
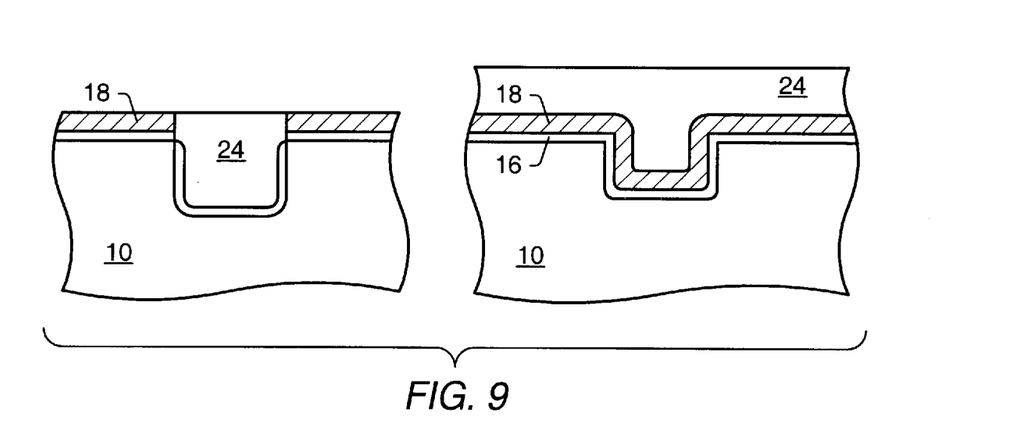
FIG. 9 is a partial cross-sectional view of the semiconductor topography, wherein the dielectric surface is polished such that the dielectric surface above the isolation trench is made coplanar with the upper surface of the first nitride layer, and the dielectric surface above the alignment mark trench is removed to a spaced distance above the first nitride layer, subsequent to the step in FIG. 8.

As depicted in FIG. 9, dielectric 24 may be polished using an apparatus similar in some respects to that shown in FIG. 1. The apparatus in FIG. 1 may be purposefully modified to accommodate an abrasive polishing surface, wherein the conduit delivers a particle-free solution. The polish rate of elevationally raised areas of dielectric 24 is substantially greater than that of elevationally recessed areas. Although not shown, first recess region 27 is densely packed with other recess regions of dielectric 24 that are formed above a closely spaced set of isolation trenches. Second recess region 29, on the other hand, is positioned away from the densely packed features of the integrated circuit. Because the elevational disparity created by recess region 29 is less than that created by recess region 29, the dielectric surface above alignment mark trench 14 may be substantially planarized before the dielectric surface above isolation trench 22. Once planarization of a surface is achieved, the polish rate of that surface slows down significantly. Accordingly, the polish rate of the substantially planarized dielectric surface above alignment mark trench 14 becomes significantly slower than that of the dielectric surface above isolation trench 22. The polishing process may be terminated after the dielectric surface within isolation trench 22 becomes level with the upper surface of nitride layer 18, while the dielectric surface above alignment mark trench 14 is still spaced above the nitride layer. The polish rate of nitride layer 18 is so slow that the nitride layer 18 acts as a polish stop layer. As a result of the polish step, dielectric 24 is removed from the nitride layer 18 positioned adjacent the isolation trench 22 while it is retained both within the isolation trench and upon the nitride layer 18 located proximate the alignment mark trench 14. The thickness of dielectric 24 remaining above nitride layer 18 may be, e.g., from 1,500 Å to 2,500 Å, preferably 1,700 Å to 2,300 Å, and in one embodiment, 2,000 Å. The thickness of dielectric 24 residing within the alignment mark trench is, e.g., from 3,000 Å to 4,000 Å, preferably 3,200 Å to 3,800 Å, and in one embodiment, 3,500 Å.

Figure 10:
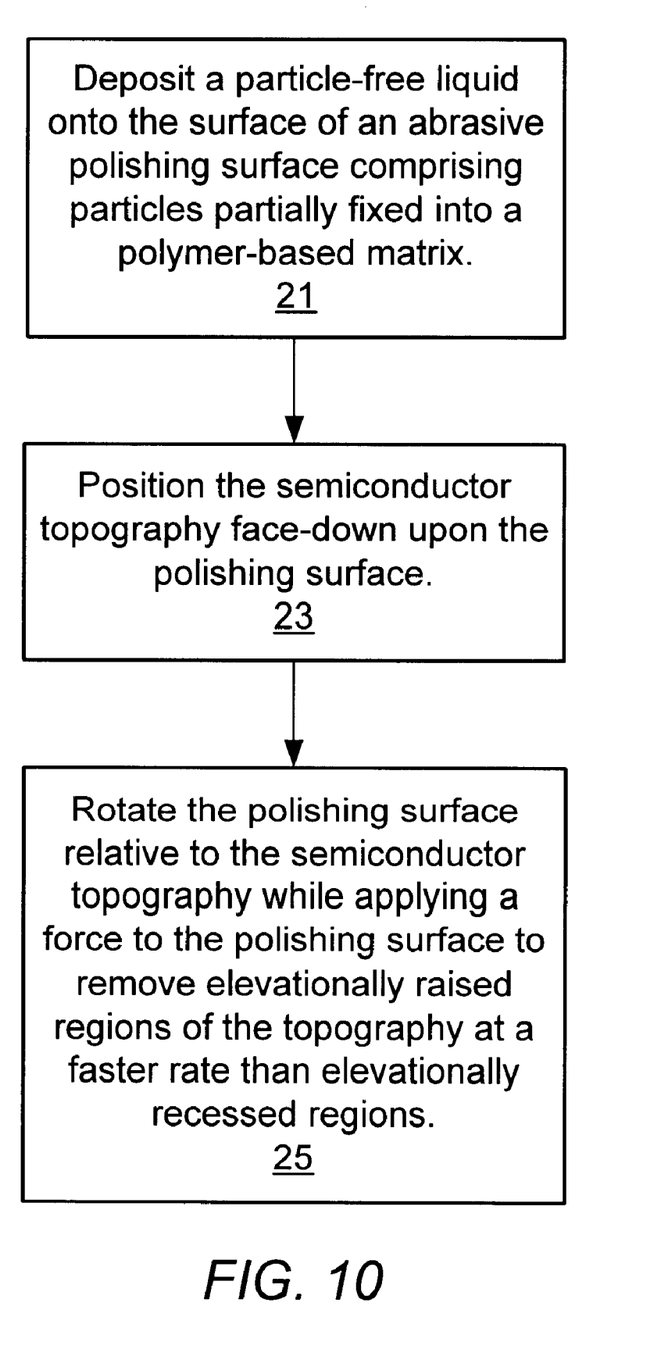
FIG. 10 is a process flow diagram of a fixed-abrasive polishing technique that may be used to polish the transparent dielectric.

FIG. 10 illustrates a process flow diagram of a fixed abrasive technique that may be used to polish dielectric 24. It is to be understood that a conventional CMP process may alternatively be employed for polishing dielectric 24. As described in block 21, a particle-free liquid is dispensed onto an abrasive polishing surface of a polishing pad having a substantially rigid supportive backing. An appropriate polishing pad is commercially available from Minnesota Mining and Manufacturing Company. The polishing surface comprises a polymer-based matrix entrained with abrasive particles. Appropriate materials that may be used for the particles include, but are not limited to, ceria, $\alpha$ alumina, $\gamma$ alumina, silicon dioxide, titania, chromia, and zirconia. Preferably, the polishing liquid forwarded onto the abrasive polishing surface is deionized water. The polishing liquid may also be other types of liquids which have a near-neutral pH. It is desirable to avoid using a polishing fluid having a highly acidic or basic pH so as to inhibit the polish rate of the nitride layer from becoming too large. As shown in block 23 of FIG. 10, the semiconductor topography depicted in FIG. 9 may be positioned face-down upon the polishing surface. The polishing liquid is positioned at the interface between the semiconductor topography and the abrasive polishing surface.

As indicated by block 25 of FIG. 10, a force that is substantially perpendicular to the backside of the semiconductor topography may then be applied to the polishing pad. The semiconductor topography and the abrasive polishing surface may be rotated relative to each other while pressure is applied to the polishing surface to remove elevationally raised regions of dielectric 24. It is believed that contact between the hill areas of dielectric 24 and the abrasive particles as well as the polishing liquid causes the surface material of dielectric 24 in those hill areas to be released from bondage with the bulk of the dielectric. The particles extending from the abrasive polishing surface have a sufficient hardness to dislodge the reacted surface material during abrasion of the hill areas. The rigidness of the polishing pad may be sufficient to prevent the abrasive surface from contacting the dielectric 24 in the valley areas. Accordingly, very little of the dielectric 24 in the valley areas is removed.

Figure 11:
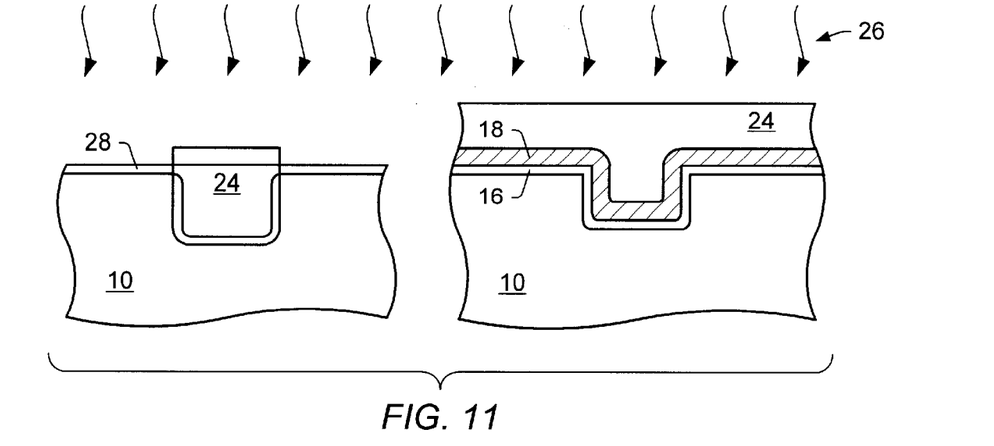
FIG. 11 is a partial cross-sectional view of the semiconductor topography, wherein a gate oxide is thermally grown upon the substrate surface adjacent the trench isolation structure, subsequent to the step in FIG. 10.
Figure 12:
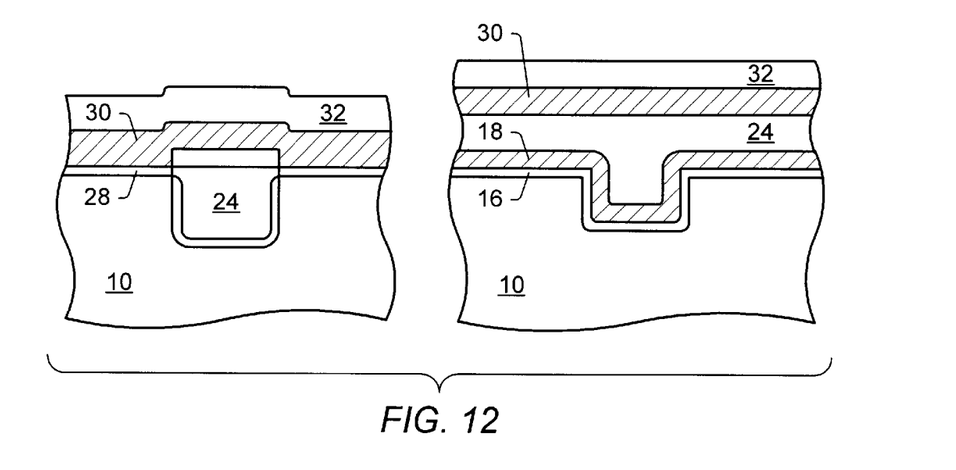
FIG. 12 is a partial cross-sectional view of the semiconductor topography, wherein a polysilicon layer and a second nitride layer are sequentially deposited upon the topography subsequent to the step in FIG. 11.
Figure 13:
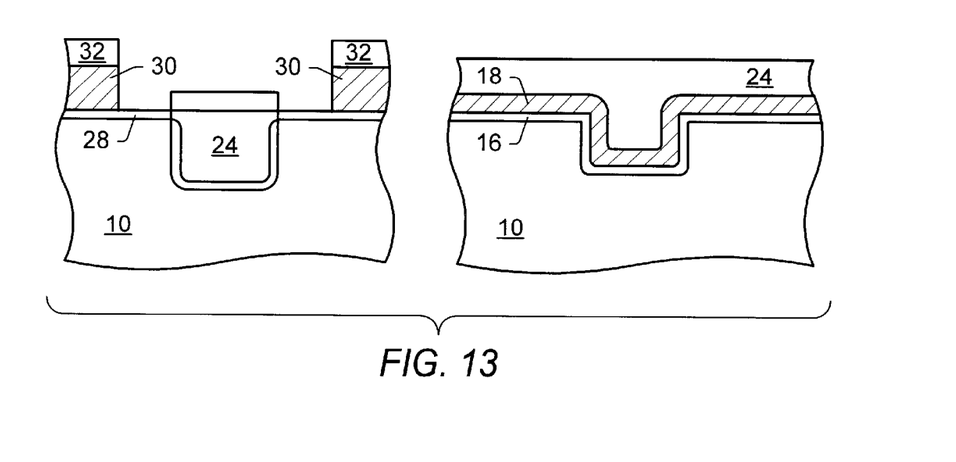
FIG. 13 is a partial cross-sectional view of the semiconductor topography, wherein the polysilicon layer and the second nitride layer are patterned to define gate conductors laterally spaced from the trench isolation structure, subsequent to the step in FIG. 12.

Turning to FIG. 11, a gate dielectric 28 is then formed upon regions of the substrate surface not covered by nitride layer 18 and dielectric 24. Gate dielectric 28 may be formed by exposing substrate 10 to radiation 26 and to an oxygen-bearing ambient. Radiation 26 may be thermal radiation supplied from an annealing furnace or radiant light supplied from, e.g., an arc lamp or a tungsten-halogen lamp during RTP. FIG. 12 depicts the formation of a polysilicon layer 30 and a nitride layer 32 upon gate dielectric 28 and dielectric 24. Polysilicon layer 30 may be CVD deposited from, e.g., a silane source, to have a thickness of, e.g., from 1,500 Å to 2,500 Å, preferably 1,800 Å to 2,200 Å, and in one embodiment 2,000 Å. Nitride layer 32 may be CVD deposited to have a thickness of, e.g., from 1,800 Å to 2,800 Å, preferably 2,100 Å to 2,500 Å, and in one embodiment 2,300 Å. FIG. 13 depicts select portions of nitride layer 32 and polysilicon layer 30 being etched to define gate conductors laterally spaced from the trench isolation structure 24 placed in the isolation trench. Optical lithography is used to define those portions of nitride layer 32 and polysilicon layer 30 that are etched. Source and drain junctions may be subsequently formed within substrate 10 on opposite sides of polysilicon gate conductors 30. Nitride sidewall spacers may later be formed laterally extending from the sidewall surfaces that bound gate conductors 30. Contact openings may thus be selectively etched through an oxide layer subsequently formed upon the topography without being concerned that the gate conductors will be exposed. That is, an etch chemistry that etches oxide at a faster rate than nitride may be used, allowing nitride layer 32 and the nitride spacers to be retained upon the gate conductors. Consequently, the nitride isolates the gate conductors from subsequently formed contacts and interconnects.

Figure 14:
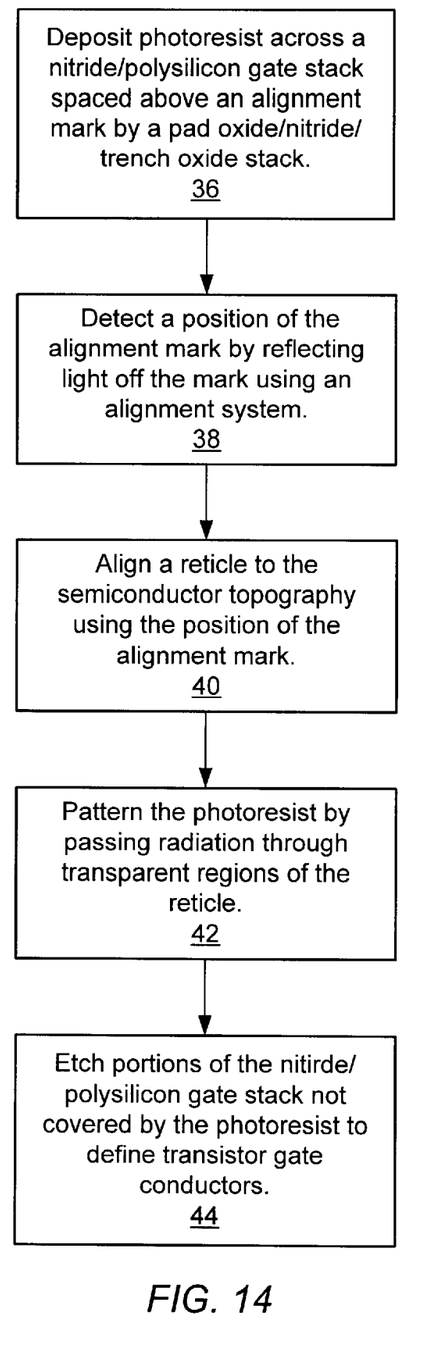
FIG. 14 is a process flow diagram of the steps required to pattern the polysilicon layer and the second nitride layer.

FIG. 14 depicts a process flow diagram of a sequence of steps that may be used to pattern nitride layer 32 and polysilicon layer 30. As indicated by block 36, photoresist is spin-on deposited across the nitride/polysilicon gate stack. The position of the alignment mark is then detected by reflecting light off the substrate using an alignment system, as described in block 38. The alignment system may be, e.g., a stepper that uses helium-neon laser light to detect alignment marks. The thickness disparity between dielectric 24 in the alignment mark trench and dielectric 24 laterally adjacent the trench affords contrasting reflectivities of light from the trench area as opposed to the area outside the trench. This difference between the reflectivity of light from the alignment mark surface and the substrate surface exterior to the alignment mark is critical to the alignment process. The alignment mark system can then align a reticle to the semiconductor topography using the position of the alignment mark, as indicated by block 40. Block 42 describes the patterning of the photoresist layer by passing radiation through transparent regions of the reticle. The solubility of those portions of the photoresist layer exposed to the radiation is altered. As such, a solvent may be used to remove the resist areas of higher solubility. If the resist is a positive resist, the areas exposed to the radiation are removed, and if the resist is a negative resist, the areas not exposed to the radiation are removed. The resulting patterned resist serves to protect underlying regions of the nitride/polysilicon gate stack from being etched. This etch step is described in block 44.

It will be appreciated to those skilled in the art having the benefit of this disclosure that this invention is believed to provide a method and system using an abrasive surface and a particle-free liquid to polish a dielectric, wherein the dielectric is deposited within an isolation trench and across a polish stop surface such that a recess region of the dielectric is spaced below the polish stop surface. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit comprising:
   polishing an upper surface of a substantially transparent dielectric over a first nitride layer to a level above an alignment mark configured in a semiconductor substrate; and
   detecting a position of the alignment mark by passing light through the dielectric and the nitride layer to the alignment mark.

2. The method of claim 1, wherein the alignment mark comprises an alignment mark trench having a floor spaced below a substrate surface adjacent the alignment mark trench.

3. The method of claim 1, wherein the semiconductor substrate further comprises an isolation trench laterally spaced from the alignment mark.

4. The method of claim 1, further comprising growing a pad oxide layer above the alignment mark and the substrate.

5. The method of claim 1, further comprising depositing a polysilicon layer and a second nitride layer across the dielectric prior to said detecting a position of the alignment mark.

6. The method of claim 3, wherein said polishing removes a first portion of the upper surface of the dielectric proximate the alignment mark to a level spaced above the first nitride layer, and simultaneously removes a second portion of the upper surface of the dielectric proximate the isolation trench to a level commensurate with an upper surface of the first nitride layer adjacent to the isolation trench.

7. The method of claim 1, wherein said polishing comprises applying an abrasive polishing surface to the upper surface of the dielectric while moving the abrasive polishing surface relative to the upper surface, thereby removing elevationally raised regions of the dielectric at a faster rate than elevationally recessed regions.

8. The method of claim 7, wherein said polishing further comprises applying a liquid substantially free of particulate matter between the abrasive polishing surface and the upper surface of the dielectric.

9. The method of claim 8, wherein the abrasive polishing surface comprises particles at least partially fixed into a polymer-based matrix, and wherein the particles comprise a material selected from the group consisting of cerium oxide, cerium dioxide, aluminum oxide, silicon dioxide, titanium oxide, chromium oxide, and zirconium oxide.

10. The method of claim 1, wherein said polishing comprises placing a CMP slurry onto a polishing pad surface, and contacting the polishing pad surface with the upper surface of the dielectric while rotating the polishing pad surface relative to the upper surface, thereby removing elevationally raised regions of the dielectric at a substantially faster rate than elevationally recessed regions.

11. The method of claim 5, further comprising:
    forming photoresist across the second nitride layer; and
    aligning a reticle above the photoresist using the position of the alignment mark.

12. The method of claim 1, wherein said polishing removes a first portion of the upper surface of the dielectric proximate the alignment mark at a first rate, and wherein said polishing simultaneously removes a second portion of the upper surface of the dielectric proximate an isolation trench laterally spaced from the alignment mark at a second rate, and wherein the first rate is less than the second rate.

13. The method of claim 1, wherein the first nitride layer is formed over the alignment mark and the semiconductor substrate.

14. The method of claim 6, wherein the dielectric proximate the alignment mark comprises the dielectric spaced above the first nitride layer over the alignment mark and the dielectric spaced above the first nitride layer over the semiconductor substrate adjacent to the alignment mark.

* * * * *